United States Patent [19]

Hindsberg et al.

[11] Patent Number: 5,162,727
[45] Date of Patent: Nov. 10, 1992

[54] METHOD AND APPARATUS OF DETERMINING THE STATOR FLUX ESTIMATE OF AN ELECTRIC MACHINE

[75] Inventors: Anders Hindsberg, Helsinki; Ilpo Ruohonen, Espoo, both of Finland

[73] Assignee: ABB Stromberg Drives Oy, Helsinki, Finland

[21] Appl. No.: 623,699

[22] Filed: Dec. 7, 1990

[30] Foreign Application Priority Data

Dec. 2, 1989 [FI] Finland .................................. 896166

[51] Int. Cl.$^5$ .............................................. G01L 3/00
[52] U.S. Cl. ............................ 324/158 MG; 318/805; 318/808
[58] Field of Search ............... 324/158 MG; 318/800, 318/803, 805; 364/483, 550

[56] References Cited

U.S. PATENT DOCUMENTS

| 4,423,367 | 12/1983 | Blaschke et al. | |
| 4,777,422 | 10/1988 | Slicker et al. | 318/808 |
| 4,884,023 | 11/1989 | Schmidt et al. | 324/158 MG |
| 4,885,519 | 12/1989 | Vogelmann | 318/805 |

FOREIGN PATENT DOCUMENTS

| 0127158 | 5/1984 | European Pat. Off. . |
| 0274716 | 7/1988 | European Pat. Off. . |
| 0310050 | 4/1989 | European Pat. Off. . |

Primary Examiner—Ernest F. Karlsen
Assistant Examiner—William J. Burns
Attorney, Agent, or Firm—Watson, Cole, Grindle & Watson

[57] ABSTRACT

The invention relates to a method of determining the estimate of the stator flux of an electric machine, comprising the determination of a stator flux estimate ($\Phi_{sest}$) of the electric machine as a time integral of the difference between the voltage ($u_s$) supplied to the stator and the product of the stator current ($i_s$) and the stator resistance estimate ($R_{sest}$), whereby the stator resistance estimate ($R_{sest}$) of the electric machine is determined by correcting the initial value or another earlier value of the stator resistance on the basis of the stator current component ($i_d^s$, $i_d^\delta$, $i_d^r$) parallel to the stator flux estimate ($\Phi_{sest}$), the air gap flux estimate ($\Phi_{\delta est}$) or the rotor flux estimate ($\Phi_{rest}$). To be able to follow changes in the stator resistance of the electric machine in different operational conditions of the machine, said current component ($i_d^s$, $i_d^\delta$, $i_d^r$) is compared with a set value ($i_d^*$) for the current component in question, the stator resistance estimate ($R_{sest}$) being changed on the basis of the result of this comparison. (FIG. 4).

4 Claims, 3 Drawing Sheets

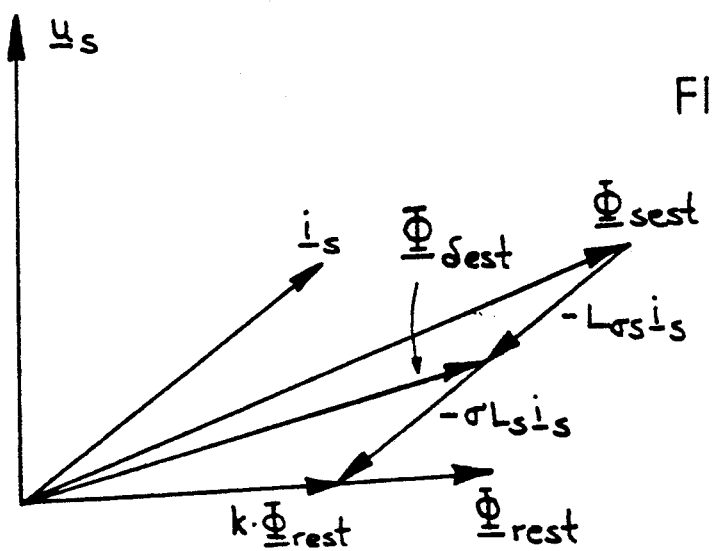

METHOD AND APPARATUS OF DETERMINING THE STATOR FLUX ESTIMATE OF AN ELECTRIC MACHINE

BACKGROUND OF THE INVENTION

1. Field of the Invention

This invention relates to a method and apparatus of determining the stator flux estimate of an electric machine, comprising the determination of a stator current taken by the electric machine;

a voltage supplied to the stator of the electric machine, a stator resistance estimate of the electric machine; and a stator flux estimate of the electric machine as a time integral of the difference between the voltage supplied to the stator and the product of the stator current and the stator resistance estimate, whereby the stator resistance estimate of the electric machine is determined by correcting the initial value or another earlier value of the stator resistance on the basis of the stator current component parallel to the stator flux estimate, the air gap flux, estimate or the rotor flux estimate.

Related art As is known, the flux produced in the stator windings of an electric machine can be determined by calculating the time integral of the voltage supplied to the stator windings. However, the voltage causing the flux is not directly the voltage $\underline{u}_s$ supplied to the poles of the winding but a voltage $\underline{e}_s$ obtained by subtracting the resistive voltage drop $R_s \cdot \underline{i}_s$ of the stator from the voltage $\underline{u}_s$.

$$\underline{e}_s = \underline{u}_s - R_s \cdot \underline{i}_s \tag{1}$$

When determining the flux of the stator side, the proportion of the voltage developing the flux and the voltage drop to the supply voltage has to be known. As the stator current is measured, and the voltage is the product of the current and the resistance according to Ohm's law, the only remaining unknown parameter is the resistance of the stator circuit. The estimated stator flux is thus obtained from the formula $$\underline{\Phi}_{sest} = \int (\underline{u}_s - R_{sest} \cdot \underline{i}_s) dt \tag{2}$$

where $\underline{\Phi}_{sest}$ = the estimated stator flux
$\underline{u}_s$ = the stator voltage
$\underline{i}_s$ = the stator current
$R_{sest}$ = the estimated stator resistance When the electric machine is operated in the constant flux range, the basic frequency $w_s$ of the machine is substantially directly proportional to the supply voltage $\underline{u}_s$. The effective value of the voltage is therefore low at low frequencies and high at high frequencies. Since the voltage drop, however, is not dependent on the frequency but merely on the stator resistance and current, the proportion of the voltage drop to the supply voltage increases with decreasing supply frequency. As a result, the influence of the stator resistance is very significant at low frequencies and therefore it is necessary to know its value the more accurately the lower the voltage supplied to the machine is.

The torque developed by the electric machine is determined by the cross product of the flux and the current. Utilizing the stator flux and stator current, the torque can be represented in the form $$T = k_1 \cdot \underline{\Phi}_s \times \underline{i}_s \tag{3}$$

where

T = the electric torque caused by the machine
$k_1$ = a constant coefficient
$\underline{\Phi}_s$ = the stator flux
$\underline{i}_s$ = the stator current Equivalently, the torque estimate $T_{est}$ of the machine is obtained by utilizing the estimated flux $\underline{\Phi}_{sest}$ and the stator current $\underline{i}_s$.

$$T_{est} = k_1 \cdot \underline{\Phi}_{sest} \times \underline{i}_s \tag{4}$$

The vector diagram of FIG. 1 of the attached drawings illustrates the influence of an error occurring in the value of the stator resistance estimate $R_{sest}$ on the estimate $T_{est}$ of the torque developed by the electric machine. If the estimated stator resistance $R_{sest}$ of Formula (1) is smaller than an actual value $R_s$, the angle between the actual stator current $\underline{i}_s$ and stator flux $\underline{\Phi}_s$ is smaller than the angle between the stator current and the estimated stator flux $\underline{\Phi}_{sest}$, whereby the actual developed torque is smaller than the torque $T_{est}$ calculated by the control system. As a result, the electric machine does not develop the desired torque. The smaller the supply voltage, the greater the difference between the calculated and the actual value of the torque will be.

Previously, there has not been any efficient method by means of which the stator flux of an electric machine could be estimated appropriately even at a low supply voltage, taking into account the stator resistance and its changes merely by means of an estimating method based on the measurement of the stator current and stator voltage.

SUMMARY OF THE INVENTION

The object of the present invention is to provide a method of determining the stator flux estimate, which method is able to follow changes in the stator resistance during operation without feedback information from the secondary side. Therefore all necessary information has to be derived from the stator voltage and stator current.

This is achieved by means of a method of the invention which is characterized in that said current component is compared with a set value of the current component in question, the stator resistance estimate being changed on the basis of the result of this comparison.

By means of the method, it is possible to continuously follow changes in the stator resistance during the operation of the machine and to take them into account when calculating the torque developed by the machine. A restriction of the method is that, in theory, it is not operable at a zero supply frequency. At high frequencies the accuracy is decreased but this is insignificant as the voltage drop of the stator is relatively small due to the high supply voltage, and the stator resistance can be assumed to be equal to zero without impairing the efficiency of the control.

BRIEF DESCRIPTION OF THE DRAWINGS

In the following the invention will be described in greater detail with reference to the attached drawings, wherein

FIG. 2b shows a vector diagram illustrating a rotor flux estimate signal and an air gap flux estimate signal;

FIG. 2a shows the vector diagram of a cage induction motor in motor operation. This vector diagram illustrates the dependence between the stator flux $\underline{\Phi}_s$, the air gap flux $\underline{\Phi}_\delta$ and the rotor flux $\underline{\Phi}_r$. On the basis of the equations (1) and (2) the stator flux $\underline{\Phi}_s$ can be calculated by integrating a voltage $\underline{e}_s$ the fundamental harmonic of which can be represented by a vector rotating at a constant frequency $w_s$.

$$\underline{e}_{sest1} = e_{sest1} \cdot e^{j \cdot w_s \cdot t} \tag{5}$$

When the time integral is calculated from this equation the fundamental harmonic $\underline{\Phi}_{sest1}$ of the stator flux will be $$\underline{\Phi}_{sest1} = -\frac{1}{jw_s} \cdot \underline{e}_{sest1} \tag{6}$$

It is to be seen that the fundamental harmonic $\Phi_{sest1}$ of the flux is also a vector rotating at the frequency $w_s$ and having a phase shift of $-90°$ with respect to the fundamental harmonic $e_{sest1}$ of the voltage. In the steady state, the above applies not only to fundamental harmonics but also to total values.

By forming the scalar product of the flux and the current and by dividing it by the absolute value of the flux, a value $i_d$ is obtained which represents the stator current component parallel to the calculated flux. Thus the current component $i_d^s$ parallel to the stator flux estimate $\underline{\Phi}_{sest}$ is $$i_d^s = \frac{\underline{\Phi}_{sest} \cdot \underline{i}_s}{|\underline{\Phi}_{sest}|} \tag{7}$$

Equivalently, the component $i_d^\delta$ parallel to the air gap estimate $\underline{\Phi}_{\delta est}$ is $$i_d^\delta = \frac{(\underline{\Phi}_{sest} - L_{\sigma s}\underline{i}_s) \cdot \underline{i}_s}{|\underline{\Phi}_{sest} - L_{\sigma s}\underline{i}_s|}, \tag{8}$$

where $L_{\sigma s}$ is the stray inductance of the stator, and $L_{\sigma s}\underline{i}_s$ represents the stray flux of the stator. Furthermore, the component $i_d^r$ parallel to the rotor flux estimate $\Phi_{rest}$ is $$i_d^r = \frac{(\underline{\Phi}_{sest} - \sigma L_s \underline{i}_s) \cdot \underline{i}_s}{|\underline{\Phi}_{sest} - \sigma L_s \underline{i}_s|}, \tag{9}$$

where $L_s$ is the stator inductance, $\sigma$ is the total dispersion coefficient and $\sigma L_s$ is the short-circuit inductance of the machine.

Figure 3:
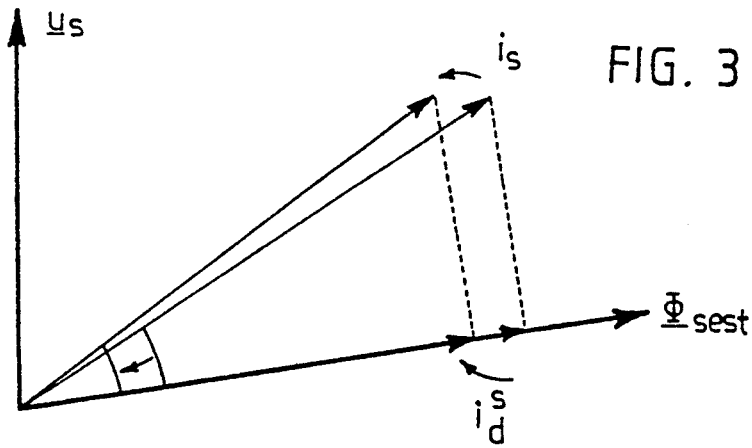
FIG. 3 illustrates the influence of an increase in the stator resistance on the stator current component parallel to the stator flux in motor operation.

FIG. 3 illustrates the influence of an increase in the stator resistance $R_s$ on the stator current component $i_d^s$ parallel to the estimated stator flux in motor operation.

In the diagram of FIG. 3, the arrows indicate the directions of change of the different vectors.

Figure 1:
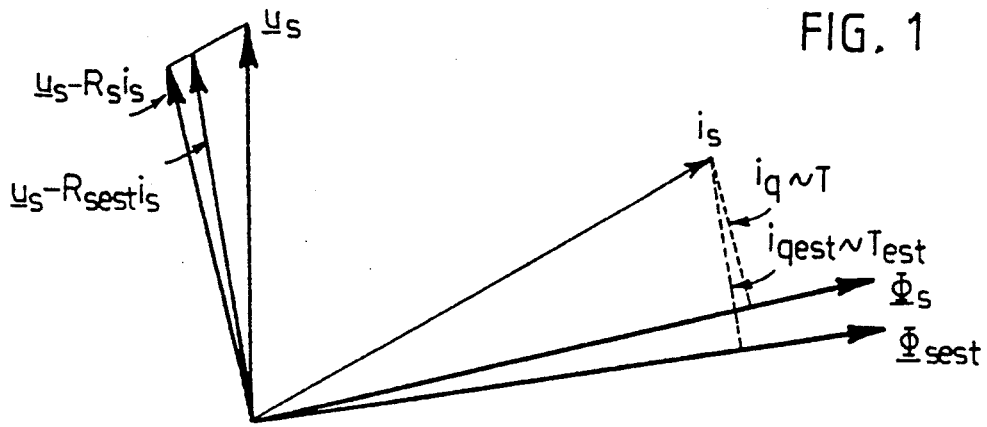
FIG. 1 illustrates the influence of an error occurring in the stator resistance estimate on the torque.
Figure 2A:
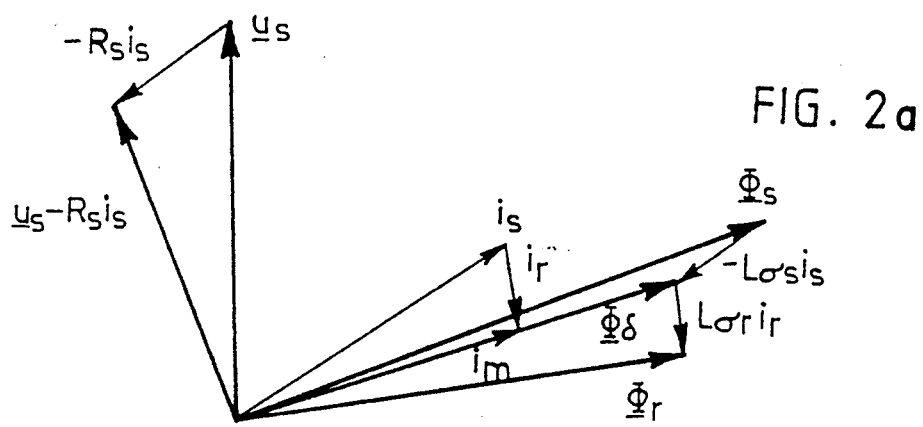
FIG. 2a shows a vector diagram of a cage induction motor in motor operation.

When the actual stator resistance $R_s$ increases, the real part of the input impedance of the electric machine increases and the stator current vector $\underline{i}_s$ rotates towards the voltage vector $\underline{u}_s$ and its absolute value is decreased. Similarly, the angle between the current $\underline{i}_s$ and the estimated stator flux $\underline{\Phi}_{sest}$ is increased. As a consequence, the current component $i_d^s$ parallel to the estimated stator flux is decreased. The same applies to the stator current component parallel to the estimated air gap flux or the estimated rotor flux, respectively, which can be judged from the vector diagram of FIG. 2 as well as from the equations (8) and (9). This information on the dependence between the change of the actual stator resistance, the stator current and the change of the current component parallel to the estimated stator, air gap or rotor flux, respectively, is utilized according to the invention in the determination of the estimate of the stator resistance. In other words, when the current component in question is observed to decrease when the machine operates as a motor, and the set value $i_d^*$ remains unchanged, the estimate of the stator resistance has to be increased in order to allow for the increase in the actual stator resistance, which originally caused the change in the current component. In motor operation, the peak value of the idle current given by the motor manufacturer or the peak value of the fundamental harmonic of the idle current measured at a high frequency, for instance, can be used as a rough set value $i_d^*$ for the stator current component $i_d^s$ parallel to the estimated stator flux.

Figure 4:
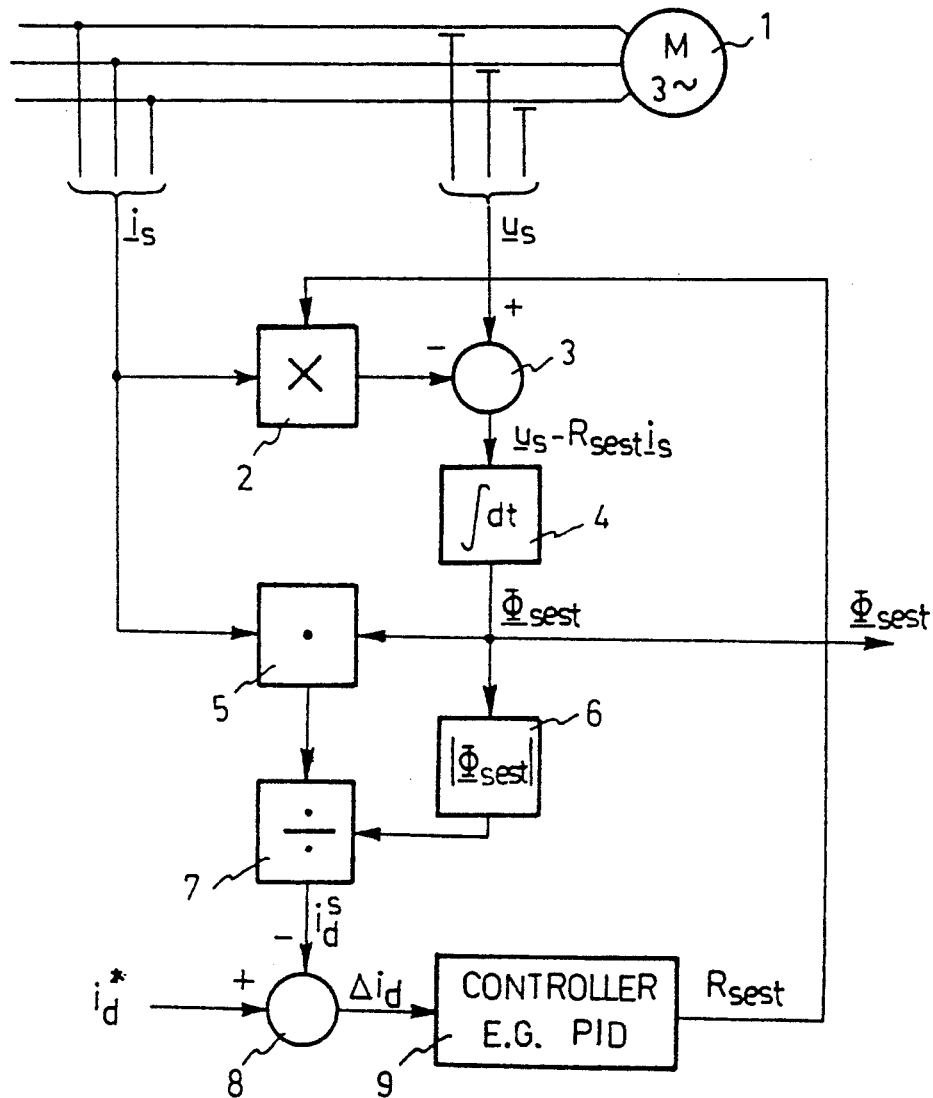
FIG. 4 is a block diagram illustrating the determination of the estimate according to the invention, utilizing the current component $i_d^s$ parallel to the stator flux estimate $\underline{\Phi}_{sest}$.

FIG. 4 is a block diagram illustrating the determination of the stator flux estimate $\Phi_{sest}$, utilizing the stator current component $i_d^s$ parallel to the estimated stator flux. In the block diagram of FIG. 4, a motor 1 is supplied from a three-stage supply. Both the current taken by the motor 1 and the operating voltage of the motor are determined from this supply in vector form. To simplify the block diagram, the current vector is indicated with the reference $\underline{i}_s$ and the voltage vector with the reference $\underline{u}_s$. In other words, they represent the rotational vectors of the stator current and the stator voltage. The stator current $\underline{i}_s$ is first applied to a multiplier 2 in which it is multiplied by the stator resistance estimate $R_{sest}$. The stator resistance estimate can be the initial value of the stator resistance estimate, which can be set to zero or determined by a dc measurement, for instance, or it may be a value given in advance by the manufacturer of the electric machine. Alternatively, the stator resistance estimate can be the value obtained for the stator resistance in a preceding calculation operation. The product $R_{sest} \cdot \underline{i}_s$ is applied from the multiplier 2 to a summer 3, where it is added with a negative sign to the stator voltage $\underline{u}_s$ to produce the voltage of Eq. (1) in the output of the summer 3. This voltage is applied to an integrator 4, which produces the time integral of this voltage in accordance with Eq. (2) to obtain the stator flux estimate $\Phi_{sest}$ at the output. This stator flux estimate is applied, on the one hand, to a multiplier 5 where it is multiplied by the stator current $\underline{i}_s$ and, on the other hand, to a unit 6 which forms its absolute value. The outputs of the units 5 and 6, in turn, are applied to a divider 7, which in accordance with Eq. (7) calculates the stator current component $i_d^s$ parallel to the estimated stator flux. This current component is added with a negative sign to the set value $i_d^*$ of the current in question in a summer 8. In this way, a difference value $\Delta i_d$ representing the magnitude of the change of the current component in question with respect to its set value is obtained in the output of the summer 8. This difference value $\Delta i_d$ is applied to a controller 9 which may be, e.g., a PID type controller which changes the initial value of the stator resistance in connection with the first calculation operation, or a value obtained from a preceding calculation operation, in proportion to the change of the difference value $\Delta i_d$ with respect to the preceding calculation operation. In this way a stator resistance estimate $R_{sest}$ corrected according to the invention is obtained in the output of the controller 9. The stator flux estimate $\underline{\Phi}_{sest}$, for instance, can form the actual output value of the block diagram of FIG. 4. The torque estimate $T_{est}$ of the machine can then be calculated from the stator flux estimate in accordance with Eq. (4).

It is to be noted that the block diagram of FIG. 4 shows only one example of the realization of the method of the invention. As mentioned above, the calculation could also be based on the utilization of the stator current component parallel to the air gap flux estimate or the rotor flux estimate. The block diagram itself could naturally be realized with other type of operational blocks than those shown.

We claim:

1. A method of determining the stator flux of an electric machine, comprising the steps of:
   supplying a stator current ($\underline{i}_s$) to the electric machine;
   supplying a voltage ($\underline{u}_s$) to the stator of the electric machine;
   estimating the stator resistance ($R_{sest}$) of the electric machine and providing a signal representative thereof;
   determining a stator flux signal ($\underline{\Phi}_{sest}$) of the electric machine as a time integral of the difference between the voltage ($\underline{u}_s$) supplied to the stator and the product of the stator current ($\underline{i}_s$) and the stator resistance signal ($R_{sest}$);
   correcting the initial value or another earlier value of the stator resistance on the basis of the stator current component signal ($i_d{}^s$, $i_d{}^\delta$, $i_d{}^r$) parallel to the stator flux signal ($\underline{\Phi}_{sest}$), an air gap flux signal ($\underline{\Phi}_{\delta est}$) or a rotor flux signal ($\underline{\Phi}_{rest}$) to determine the stator resistance signal ($R_{sest}$) of the electric machine;
   comparing said current component signal ($i_d{}^s$, $i_d{}^\delta$, $i_d{}^r$) with a set value signal ($i_d{}^*$) for the current component in question; and
   changing the stator resistance signal ($R_{sest}$) on the basis of the result of this comparison.

2. A method according to claim 1, further comprising the step of adding said current component signal ($i_d{}^s$, $i_d{}^\delta$, $i_d{}^r$) with a negative sign to the set value signal ($i_d{}^*$) of the current component in question to obtain a difference value signal ($\Delta i_d$) representing the magnitude of the change of the current component for use in the correction of the stator resistance signal ($R_{sest}$).

3. Apparatus for determining the stator flux of an electric machine, comprising:
   means for supplying a stator current ($\underline{i}_s$) to the electric machine;
   means for supplying a voltage ($\underline{u}_s$) to the stator of the electric machine;
   means for estimating the stator resistance ($R_{sest}$) of the electric machine and generating a signal representative thereof;
   means for determining a stator flux signal ($\underline{\Phi}_{sest}$) of the electric machine as a time integral of the difference between the voltage ($\underline{u}_s$) supplied to the stator and the product of the stator current ($\underline{i}_s$) and the stator resistance signal ($R_{sest}$);
   means for correcting the initial value or another earlier value of the stator resistance on the basis of the stator current component signal ($i_d{}^s$, $i_d{}^\delta$, $i_d{}^r$) parallel to the stator flux signal ($\underline{\Phi}_{sest}$) or a rotor flux signal ($\underline{\Phi}_{rest}$) to determine the stator resistance signal ($R_{sest}$) of the electric machine;
   means for comparing said current component signal ($i_d{}^s$, $i_d{}^\delta$, $i_d{}^r$) with a set value signal ($i_d{}^*$) for the current component in question; and
   means for changing the stator resistance signal ($R_{sest}$) on the basis of the result of this comparison.

4. Apparatus according to claim 3, further comprising means for adding said current component signal ($i_d{}^s$, $i_d{}^\delta$, $i_d{}^r$) with a negative sign to the set value signal ($i_d{}^*$) of the current component in question to obtain a difference value signal ($\Delta i_d$) representing the magnitude of the change of the current component for use in the correction of the stator resistance signal ($R_{sest}$).

* * * * *